(12) United States Patent
Terashita et al.

(10) Patent No.: US 6,515,879 B2
(45) Date of Patent: Feb. 4, 2003

(54) POWER SOURCE FILTER CIRCUIT THAT IS CAPABLE OF ELIMINATING NOISE COMPONENT SUPPLIED FROM POWER SOURCE AND DRIVING NOISE COMPONENT GENERATED FROM INDUCTION LOAD SIMULTANEOUSLY

(75) Inventors: Satoshi Terashita, Miyagi-ken (JP); Satoshi Sakamoto, Miyagi-ken (JP); Hiroaki Nakaya, Miyagi-ken (JP); Takahiro Iwakiri, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/120,642

(22) Filed: Apr. 11, 2002

(65) Prior Publication Data

US 2002/0149952 A1 Oct. 17, 2002

(30) Foreign Application Priority Data

Apr. 17, 2001 (JP) .................................. 2001-118367

(51) Int. Cl.[7] .......................... H02M 1/12; H02M 1/14
(52) U.S. Cl. ............................................ 363/39; 363/40
(58) Field of Search ................................ 363/40, 39, 41

(56) References Cited

U.S. PATENT DOCUMENTS

| | | | | |
|---|---|---|---|---|
| 3,793,593 A | * | 2/1974 | Kennedy et al. | 330/103 |
| 4,055,807 A | * | 10/1977 | Priniski et al. | 455/78 |
| 4,075,552 A | * | 2/1978 | Traficante et al. | 324/322 |
| 4,745,478 A | * | 5/1988 | Nakagawa et al. | 348/706 |
| 4,794,353 A | | 12/1988 | Broyde | |
| 4,918,591 A | | 4/1990 | Link | |
| 5,015,975 A | | 5/1991 | Okubo | |
| 5,214,525 A | * | 5/1993 | Gershman et al. | 250/214 A |
| 5,241,228 A | * | 8/1993 | Uno et al. | 327/105 |
| 5,903,450 A | * | 5/1999 | Johnson et al. | 323/903 |
| 6,025,763 A | * | 2/2000 | Morimoto | 310/313 C |

FOREIGN PATENT DOCUMENTS

JP        Hei 10-262949        10/1998

OTHER PUBLICATIONS

F. Broyde, E. Clavelier: "Designing Power–line Filter for Their Worst–Case Behavior" Proceedings of the 9th International Zurich Symposium on EMC, Mar. 12–14, 1991, pp. 583–588.

* cited by examiner

*Primary Examiner*—Bao Q. Vu
(74) *Attorney, Agent, or Firm*—Brinks Hofer Gilson & Lione

(57) ABSTRACT

The power source filter circuit is provided with a first inductor and a second inductor connected in series between an input terminal and an output terminal, a first capacitor connected between the input terminal and a reference potential point, a second capacitor connected between a contact point that connects the first inductor with the second inductor and the reference potential point, a third capacitor connected between the output terminal and the reference point, and a first resistance and a second resistance having a small resistance value connected to the second inductor in parallel respectively.

9 Claims, 1 Drawing Sheet

POWER SOURCE FILTER CIRCUIT THAT IS CAPABLE OF ELIMINATING NOISE COMPONENT SUPPLIED FROM POWER SOURCE AND DRIVING NOISE COMPONENT GENERATED FROM INDUCTION LOAD SIMULTANEOUSLY

BACKGROUND OF THE INVENTION

1. Field of the Invention

This invention relates to a power source filter circuit, and more particularly relates to a power source filter circuit that is capable of eliminating noise component supplied from a power source and driving noise component generated from an induction load simultaneously.

2. Description of the Related Art

A π-filter circuit and T-type filter circuit have been known as the typical conventional power source filter circuit connected between a direct current power source and a load circuit. In this case, a π-type filter circuit comprises an inductor connected in series between an input terminal and an output terminal, a first capacitor connected between the input terminal and a reference potential point, and a second capacitor connected between the output terminal and the reference potential point. On the other hand, a T-type filter circuit comprises a first inductor and a second inductor connected in series between an input terminal and an output terminal, and a capacitor connected between the contact point formed between the first inductor and the second inductor and a reference potential point. An inductance value of the inductor and the capacitance value of the first capacitor and second capacitor are selected suitably in the case of the π-type filter circuit, and on the other hand the inductance value of the first inductor and the second inductor and a capacitance value of the capacitor are selected suitably in the case of the T-type filter circuit to filter and eliminate effectively various noise components included in a direct current supplied from a power source and supply a direct current rid of various noise components to a load.

Furthermore, in the case where various noise components are included in a direct current supplied from a direct current power source, it has been known that a double π-type filter circuit that is formed of two cascade-connected π-type filter circuits is used or a double T-type filter circuit that is formed of two cascade-connected T-type filter circuits is used as the power source filter circuit.

The π-type filter circuit and the T-type filter circuit that have been used for the known power source filter circuit are capable of filtering and eliminating various noise components included in a direct current supplied from a direct current power source to thereby prevent such various noise components from being supplied to a load. However, in the case where an inductive load such as a motor is connected as the load and the inductive load generates a noise (conductive noise) component having a relatively high frequency when the inductive load is operated, the π-type filter circuit and T-type filter circuit cannot filter and eliminate the generated noise component and the noise component generated from the inductive load affects other structural components in some cases.

SUMMARY OF THE INVENTION

The present invention has been accomplished in view of the technical background as described hereinabove, and it is the object of the present invention to provide a power source filter circuit that is capable of filtering and eliminating both various noise components included in a direct current supplied from a direct current power source and a noise component generated from a load effectively.

To accomplish the abovementioned object, a power source filter circuit in accordance with the present invention has a means provided with a first inductor and a second inductor connected in series between an input terminal and an output terminal, a first capacitor being connected between the input terminal and a reference potential point, a second capacitor being connected between the contact point that connects the first inductor with the second inductor and the reference potential point, a third capacitor being connected between the output terminal and the reference point, and a second being connected to the second inductor in parallel.

Furthermore, in the power source circuit in accordance with the present invention, a direct current power source is connected to the input terminal, an induction load is connected to the output terminal, and a direct current generated from the direct current power source is supplied to the induction load through the first inductor, second inductor, and resistance.

According to the abovementioned means, relatively low frequency various noise components included in a direct current supplied from a power source are filtered and eliminated by a π-type filter circuit comprising a first inductor, a first capacitor, and a second capacitor, and relatively high frequency various noise components included in the direct current are filtered and eliminated by a parallel circuit comprising a second inductor and resistance that exhibits low impedance to the high frequency noise and by a π-type filter circuit comprising a second capacitor and third capacitor. As the result, the direct current supplied to an output terminal does not include the various noise components. Furthermore, the relatively high frequency noise component generated from a load is filtered and eliminated similarly by a parallel circuit comprising a second inductor and resistance that exhibits low impedance to the high frequency noise and by a π-type filter circuit comprising a second capacitor and third capacitor. As the result, the noise level of the noise component generated from the load is reduced, and the noise component does not affect other structural components adversely.

In the power source filter circuit in accordance with the present invention, the resistance comprising two resistances connected in parallel is used.

By applying the abovementioned structure, the heat generation of the resistance is reduced even though a large current flows through the resistance, and the skin effect of the resistance to the relatively high frequency noise component is eliminated.

Furthermore, in the power source filter circuit in accordance with the present invention, an integrated resistance value is as small as 10Ω or smaller.

The power source filter circuit having the structure as described hereinabove causes the direct current voltage drop due to connection of a resistance scarcely, and exhibits low impedance to the relatively high frequency noise component.

DETAILED DESCRIPTION OF THE PREFERRED EMBODIMENTS

Embodiments of the present invention will be described in detail hereinafter with reference to the drawings.

Figure 1:
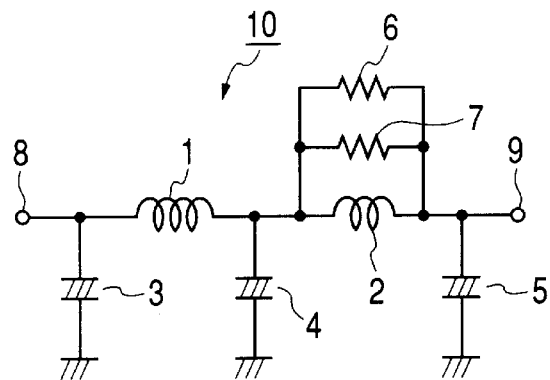
FIG. 1 is a circuit diagram showing the structure of an embodiment of a power source filter circuit in accordance with the present invention.

FIG. 1 is a circuit diagram showing the structure of one embodiment of a power source filter circuit in accordance with the present invention.

As shown in FIG. 1, the power source filter circuit 10 in accordance with the embodiment comprises a first inductor 1, a second inductor 2, a first capacitor 3, a second capacitor 4, a third capacitor, a first resistance 6, a second resistance 7, an input terminal 8, and an output terminal 9. In this case, the first resistance 6 and second resistance 7 having a resistance value of 10Ω are used respectively, and the integrated resistance value of the first resistance 6 and the second resistance 7 is 5Ω resultantly.

One end of the first inductor 1 is connected to the input terminal 8 and one end of the first capacitor 3, and the other end is connected to the one end of the second inductor 2, one end of the second capacitor 4, one end of the first resistance 6, and one end of the second resistor 7. The other end of the second inductor 2 is connected to the output terminal 9, one end of the third capacitor 5, the other end of the first resistance 6, and the other end of the second resistance 7. The other end of the first capacitor 3 is connected to the earthing point (reference potential point), the other end of the second capacitor 4 is connected to the earthing point (reference potential point), and the other end of the third capacitor 5 is connected to the earthing point (reference potential point).

Figure 2:
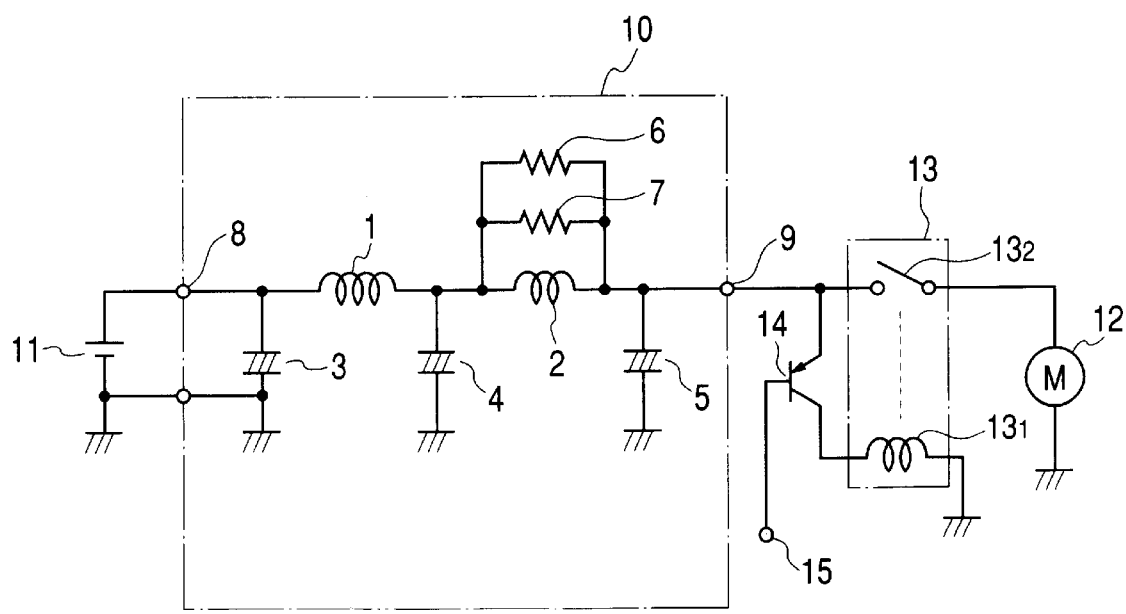
FIG. 2 is a circuit diagram showing the structure of the power source filter circuit shown in FIG. 1 and the structure of peripheral circuits connected to the power source filter circuit.

Next, FIG. 2 is a circuit diagram showing the structure of the power source filter circuit 10 shown in FIG. 1 and one exemplary structure of a peripheral circuit connected to the power source filter circuit 10.

In FIG. 2, the same structural components as those shown in FIG. 1 are given the same characters.

As shown in FIG. 2, the peripheral circuit of the power source filter circuit 10 comprises a direct current power source 11, a motor 12, a relay circuit 13 having a control winding 13, and a normally open contact point $13_2$, a driving transistor 14, and a control terminal 15.

The one end of the direct current power source 11 (positive voltage output terminal) is connected to the input terminal 8, and the other end (negative voltage output terminal) is connected to the earthing point (reference potential point). One end of the motor 12 is connected to the one end of the normally open contact point $13_2$ of the relay circuit 13, and the other end is connected to the earthing point (reference potential point). One end of the control winding $13_1$ of the relay circuit 13 is connected to the collector of the driving transistor 14, and the other end is connected to the earthing point (reference potential point). The other end of the normally open contact point $13_2$ of the relay circuit 13 is connected to the output terminal 9 and the emitter of the driving transistor 14. The base of the driving transistor is connected to the control terminal 15.

In this case, when the direct current power source 11 is connected to the input terminal 8 and a control voltage of the reference potential is supplied to the control terminal 15, the driving transistor is turned on, a driving current is supplied to the control winding $13_1$ of the relay circuit 13 through the driving transistor 14 that has been turned on, and the normally open contact point $13_2$ is closed thereby. When the normally open contact point $13_2$ is closed, a direct current supplied to the output terminal 9 is supplied to the motor 12 through the closed normally open contact point $13_2$, and the motor 12 is driven rotationally.

On the other hand, in the case where a positive control voltage is supplied to the control terminal 15 when the motor 12 is driven rotationally, the driving transistor 14 is turned off, the driving current supplied to the control winding $13_1$, of the relay circuit 13 due to the driving transistor 14 that has been turned on is shut down, and the normally open contact point $13_2$ is opened resultantly. When the normally open contact point $13_2$ is opened, the direct current that has been supplied to the output terminal 9 is shut down and the current supply to the motor 12 is discontinued, and the motor 12 stops rotational driving.

The power source filter circuit 10 is operated as described herein under when the motor 12 is driven rotationally.

A direct current generated from the direct current power source 11 is supplied to the power source filter circuit 10 through the input terminal 8. At that time, the supplied direct current includes a pure direct current component, relatively low frequency various noise components, and relatively high frequency various noise components. Among these components, the pure direct current component passes through the first inductor 1, and is supplied to the output terminal 9 through the second inductor 2 and/or the parallel circuit comprising the first resistance 6 and second resistance 7 without attenuation. Furthermore, the relatively low frequency various noise components are filtered and eliminated by the input side π-type filter circuit comprising the first inductor 1, first capacitor 3, and second capacitor 4, and are not supplied to the output terminal 9. Furthermore, the relatively high frequency various noise components are partially filtered and eliminated by the input side π-type filter circuit comprising the first inductor 1, first capacitor 3, and second capacitor 4, and next the residual noise components are filtered and eliminated by the parallel circuit comprising the second inductor 2, first resistance 6, and second resistance 7 that exhibits low impedance to the relatively high frequency various noise components and by the output side π-type filter circuit comprising the second capacitor 4 and third capacitor 5. As the result, the relatively high frequency various noise components are not supplied to the output terminal 9.

On the other hand, while the motor 12 is being driven rotationally, the rotation generates a noise component, which is mainly the relatively high frequency conductive noise component, and the relatively high frequency noise component appears on the connection lead wire of the output terminal 9. In this case, in the view of the power source filter circuit 10 side from the output terminal 9, because the parallel circuit comprising the second inductor 2, first resistance 6, and second resistance 7 and the output side π-type filter circuit comprising the second capacitor 4 and third capacitor 5 exhibit low impedance to the relatively high frequency noise component, the relatively high frequency noise component that has appears on the connection lead wire of the output terminal 9 flows to the output side π-type filter circuit and filtered and eliminated thereby.

As described hereinabove, according to the power source filter circuit 10 in accordance with the present embodiment, when a direct current is supplied to the power source filter circuit 10, the relatively low frequency various noise components and the relatively high frequency various noise components included in the direct current are filtered and eliminated by the power source filter circuit 10, and furthermore the relatively high frequency conductive noise component caused from rotational driving of the motor 12 is also filtered and eliminated similarly by the power source filter circuit 10. As the result, only the pure direct current component is supplied from the power source filter circuit 10.

A case where the resistance value of the first resistance 6 and second resistance 7 connected to the second inductor 2 in parallel is 10Ω respectively and the integrated resistance value is 5Ω is described exemplarily in the abovementioned embodiment. Though a resistance value of approximately 10Ω is preferable as the resistance value of the first resistance 6 and second resistance 7 of the power source filter circuit 10 in accordance with the present invention and an integrated resistance value of approximately 5Ω is preferable, but the resistance value is by no means limited to the abovementioned case where the resistance value of the first resistance 6 and second resistance 7 is 10Ω and the integrated resistance value is 5Ω, and otherwise the resistance value of the first resistance 6 and the second resistance 7 may be selected properly depending on the current that flows through the first resistance 6 and second resistance 7. The maximum resistance value of the first resistance and second resistance 7 is preferably 20Ω and the maximum integrated resistance value is preferably 10Ω to satisfy the condition that the pure direct current component is not attenuated by the first resistance 6 and second resistance 7 and the parallel circuit comprising the second inductor 2, first resistance 6, and second resistance 7 exhibits low impedance to the relatively high frequency noise component.

A case where two resistances, namely the first resistance 6 and second resistance 7, are connected in parallel is exemplified in the abovementioned embodiment, the combination of the resistance used in the power source filter circuit 10 in accordance with the present invention is by no means limited to the abovementioned case where two resistances, namely the first resistance 6 and second resistance 7, are connected in parallel, but otherwise one resistance is provided instead of two resistances connected in parallel in the case where the power quantity and heat quality are not tight.

A case where the motor 12 is connected as the load is exemplified in the abovementioned embodiment, but the load of the power source filter circuit 10 in accordance with the present invention is by no means limited to a motor, and a load other than a motor 12 may be applied similarly as long as the load is an induction load.

As described hereinbefore, according to the present invention, relatively low frequency various noise components included in a direct current supplied from a power source are filtered and eliminated by a π-type filter circuit comprising a first inductor, a first capacitor, and a second capacitor, and the relatively high frequency various noise components included in the direct current are filtered and eliminated by a parallel circuit comprising a second inductor and resistance that exhibits low impedance to the high frequency noise and by a π-type filter circuit comprising a second capacitor and third capacitor. As the result, the direct current supplied to an output terminal scarcely includes the various noise components. Furthermore, the relatively high frequency noise component generated from a load is filtered and eliminated similarly by a parallel circuit comprising a second inductor and resistance that exhibits low impedance to the high frequency noise and by a π-type filter circuit comprising a second capacitor and third capacitor. As the result, the noise level of the noise component generated from the load is reduced, and the noise component does not affect other structural components adversely.

What is claimed is:

1. A power source filter circuit comprising a first inductor and a second inductor connected in series between an input terminal and an output terminal, a first capacitor connected between the input terminal and a reference potential point, a second capacitor connected between a contact point that connects the first inductor with the second inductor and the reference potential point, a third capacitor connected between the output terminal and the reference potential point, and a resistance connected between the contact point and the output terminal in parallel with the second inductor.

2. The power source filter circuit according to claim 1, wherein the resistance is formed by connecting two resistances in parallel.

3. The power source filter circuit according to claim 1, wherein an integrated resistance value of the resistance is at most 10Ω.

4. The power source filter circuit according to claim 1, wherein the output terminal is connected to a motor as a load.

5. The power source filter circuit according to claim 2, wherein an integrated resistance value of the resistance is at most 10Ω.

6. The power source filter circuit according to claim 2, wherein the output terminal is connected to a motor as a load.

7. The power source filter circuit according to claim 3, wherein the output terminal is connected to a motor as a load.

8. The power source filter circuit according to claim 5, wherein the output terminal is connected to a motor as a load.

9. The power source filter circuit according to claim 1, wherein a direct current power source is connected to the input terminal, wherein an induction load is connected to the output terminal, and wherein a direct current generated from the direct current power source is supplied to the induction load through the first inductor, the second inductor, and the resistance.

* * * * *